(12) United States Patent
Bringoltz et al.

(10) Patent No.: US 9,726,984 B2
(45) Date of Patent: Aug. 8, 2017

(54) APERTURE ALIGNMENT IN SCATTEROMETRY METROLOGY SYSTEMS

(71) Applicant: KLA-Tencor Corporation, Milpitas, CA (US)

(72) Inventors: Barak Bringoltz, Rishon le Tzion (IL); Nadav Carmel, Mevasseret-Zion (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/483,733

(22) Filed: Sep. 11, 2014

(65) Prior Publication Data

US 2015/0015883 A1 Jan. 15, 2015

Related U.S. Application Data

(63) Continuation of application No. PCT/US2014/045605, filed on Jul. 7, 2014.

(60) Provisional application No. 61/844,271, filed on Jul. 9, 2013.

(51) Int. Cl.
*G01B 11/00* (2006.01)
*G03F 7/20* (2006.01)

(52) U.S. Cl.
CPC ...... *G03F 7/70633* (2013.01); *G03F 7/70258* (2013.01)

(58) Field of Classification Search
CPC .. G01B 11/27; G03F 7/70633; G03F 7/70258
USPC .................................................. 356/399–401
See application file for complete search history.

(56) References Cited

U.S. PATENT DOCUMENTS

| 6,141,094 A * | 10/2000 | Tong ................... G01N 21/74 356/300 |
|---|---|---|
| 7,123,398 B2 * | 10/2006 | Niggl ..................... G01J 3/04 356/310 |
| 8,908,175 B1 * | 12/2014 | Kandel ............... G01N 21/211 356/237.4 |
| 2002/0033457 A1 * | 3/2002 | Chalupka ........... H01J 37/3045 250/491.1 |
| 2005/0002035 A1 * | 1/2005 | Mishima .............. G03F 9/7026 356/401 |
| 2005/0069790 A1 * | 3/2005 | Gruss ................. G03F 7/70633 430/22 |
| 2005/0195398 A1 * | 9/2005 | Adel ...................... B82Y 10/00 356/401 |
| 2006/0103033 A1 * | 5/2006 | Van Haren .......... G03F 7/70633 257/797 |
| 2009/0015836 A1 * | 1/2009 | Maeda ................... G03F 7/706 356/400 |
| 2011/0043791 A1 * | 2/2011 | Smilde ............... G03F 7/70633 356/128 |

(Continued)

*Primary Examiner* — Tarifur Chowdhury
*Assistant Examiner* — Isiaka Akanbi
(74) *Attorney, Agent, or Firm* — Suiter Swantz pc llo

(57) ABSTRACT

Methods and algorithms are provided, as well as new metrics for misalignment of apertures with respect to the optical axis of a metrology system. The methods comprise aligning aperture(s) to an optical axis of a scatterometry metrology tool using correction term(s) derived by minimizing an overlay variation measure calculated with respect to overlay measurements of a periodic structure. These methods result in highly sensitive misalignment metrics, which may be used in calibration stages or on the fly to align the system's apertures, and enable reducing target size due to the resulting enhanced alignment accuracy.

28 Claims, 4 Drawing Sheets

(56) References Cited

U.S. PATENT DOCUMENTS

| | | | | |
|---|---|---|---|---|
| 2012/0044470 A1* | 2/2012 | Smilde | ............... | G03F 1/44 355/53 |
| 2013/0308142 A1* | 11/2013 | Straaijer | ............ | G01B 11/24 356/625 |
| 2014/0065736 A1* | 3/2014 | Amir | ............... | H01L 23/544 438/14 |

* cited by examiner

*200*

- 210 — ALIGNING APERTURE(S) TO THE OPTICAL AXIS OF A SCATTEROMETRY METROLOGY TOOL
- 215 — DERIVING CORRECTION TERM(S) TO ALIGN THE APERTURE(S)
- 220 — MINIMIZING AN OVERLAY VARIATION MEASURE RELATING TO OVERLAY MEASUREMENTS OF A PERIODIC STRUCTURE
- 222 — PERFORMING SEVERAL SCATTEROMETRY MEASUREMENTS OF A CALIBRATION TARGET WHICH HAS A ZERO OVERLAY
- 225 — MEASURING THE OVERLAY ALONG AND/OR ACROSS THE PERIODIC STRUCTURE
- 227 — USING A PERIODIC STRUCTURE AT A SINGLE LAYER AND LACKING AN OVERLAY
- 228 — VARYING THE MISALIGNMENT BETWEEN THE MEASUREMENTS
- 230 — MEASURING THE OVERLAY AT A PUPIL PLANE

Figure 3

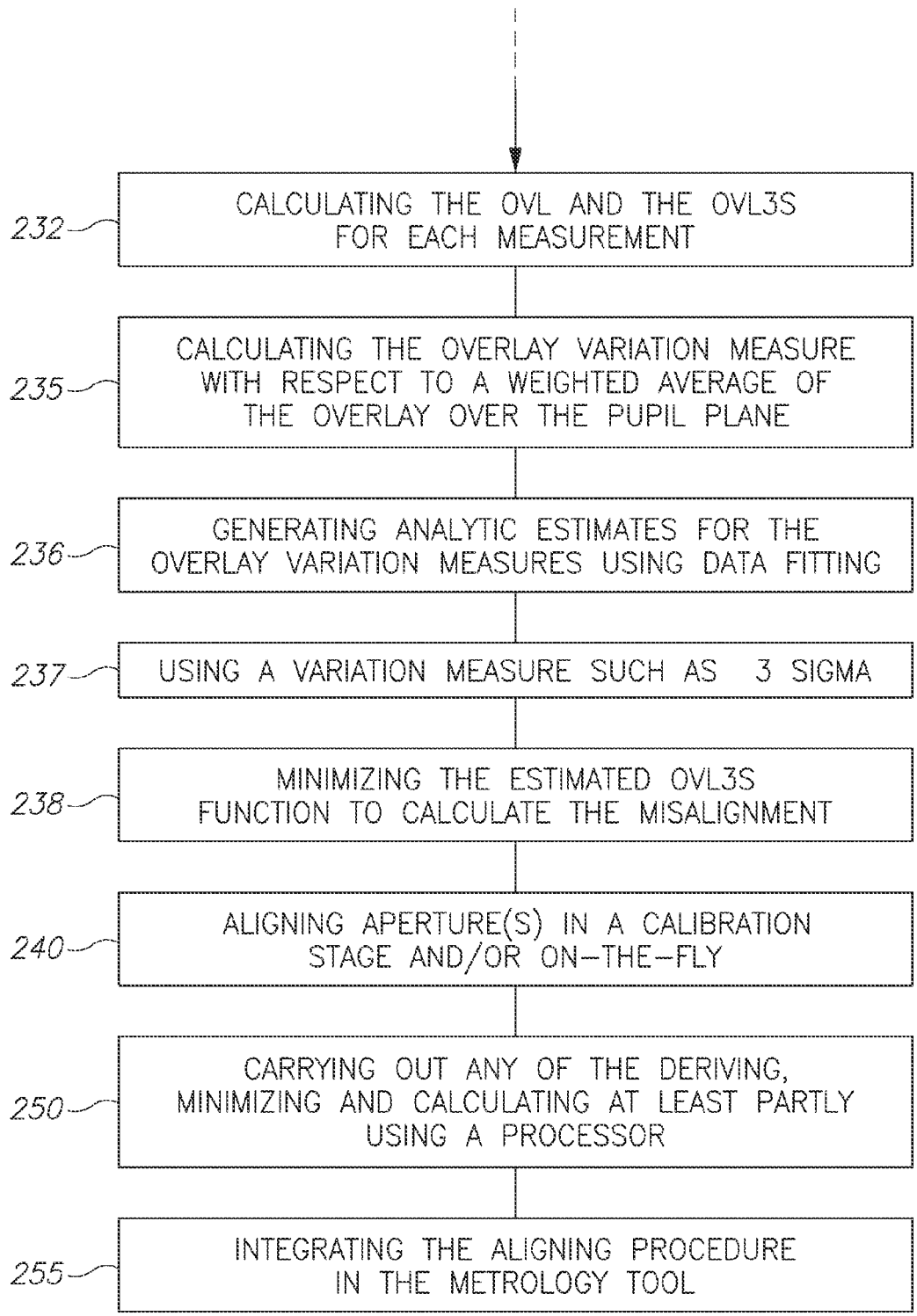
Figure 3 (cont. 1)

APERTURE ALIGNMENT IN SCATTEROMETRY METROLOGY SYSTEMS

CROSS-REFERENCE TO RELATED APPLICATIONS

This application is filed under 35 U.S.C. §120 and §365(c) as a continuation of PCT International Patent Application No. PCT/US2014/045605 filed Jul. 7, 2014, which application claims the benefit of U.S. Provisional Patent Application No. 61/844,271 filed on Jul. 9, 2013, which applications are incorporated herein by reference in their entirety.

BACKGROUND OF THE INVENTION

1. Technical Field

The present invention relates to the field of scatterometry metrology, and, more particularly, to aperture alignment in scatterometry metrology tools.

2. Discussion of Related Art

The varied overlay measurement technologies that rely on scatterometry require that the radiation spot be aligned within the apertures of the overlay tool. A misalignment causes a symmetry breaking in the signal which, in turn, causes an overlay error that depends on the system parameters (like wavelength, illumination numerical aperture, illumination apodization, size, shape, and apodization of the field stop), and on the target parameters (like the wafer reflectivity, the target size, and the structures in the exterior of the overlay target). This error can be sizable and may harm both the accuracy of the measurement and its repeatability. Specifically, because this error is due to a system misalignment it can be regarded as a tool-induced shift, which, at least in the overlay scatterometry case, is one of the important performance parameters that is required to be tightly bounded from above.

SUMMARY OF THE INVENTION

One aspect of the present invention provides a method comprising aligning at least one aperture to an optical axis of a scatterometry metrology tool using at least one correction term derived by minimizing an overlay variation measure calculated with respect to overlay measurements of a periodic structure.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1B:
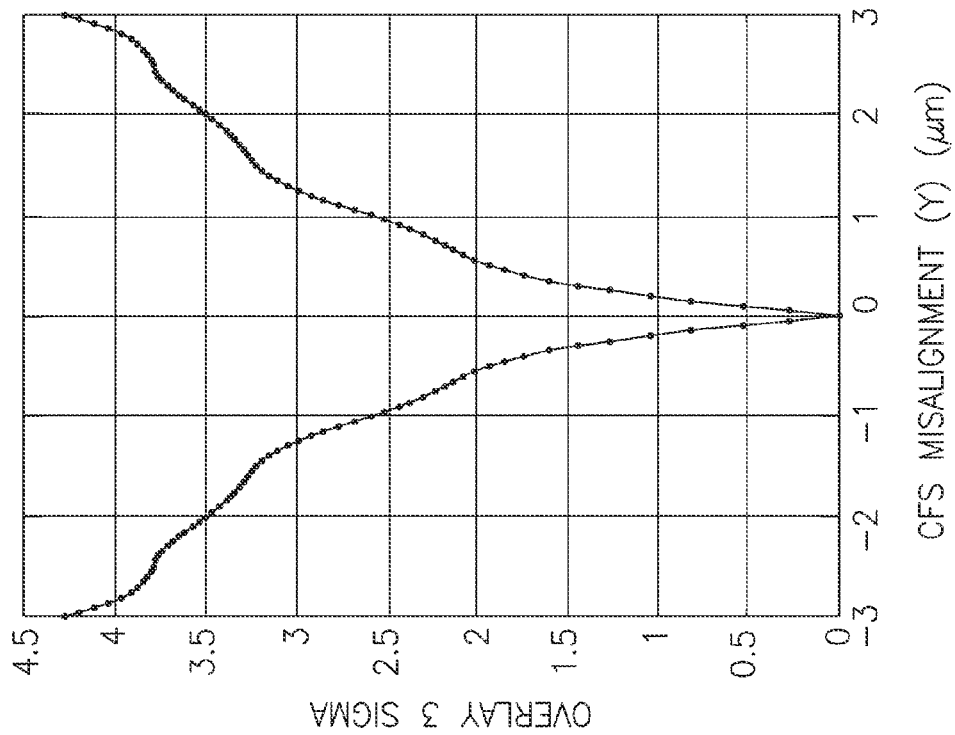
FIG. 1B is a graphical representation of exemplary simulation results that illustrate the minimization of the overlay variation measure, according to some embodiments of the invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Methods and algorithms are provided, as well as new metrics for misalignment of apertures with respect to the optical axis of a metrology system. Methods comprise aligning aperture(s) to an optical axis of a scatterometry metrology tool using correction term(s) derived by minimizing an overlay variation measure calculated with respect to overlay measurements of a periodic structure. These methods result in highly sensitive misalignment metrics, which may be used in calibration stages or on the fly to align the system's apertures, and enable reducing target size due to the resulting enhanced alignment accuracy.

The disclosed invention enables alignment of apertures placed in an optical metrology tool using scatterometric overlay signals and provides accurate aperture alignment including in the metrology of non-overlay features such as the critical dimension (CD), etc. The disclosed invention is superior to current resolution-based methodologies for calibrating the aperture-to-optical axis alignment, which are more cumbersome and time-consuming. The disclosed methods (including alignment algorithms, alignment metrics and respective implementations in computer program products and modules) are simpler and quicker in application and provide the required very high accuracy level, which may reach a few or tens of nanometers in wafer coordinates. The high accuracy level is achieved in the disclosed invention by using pupil signals which are very sensitive to aperture misalignment.

The disclosed methods are applicable to all type of scatterometry overlay (SCOL) technologies, including but not restricted to, technologies that rely on the intensities within 1st order diffraction signals, within 0th order diffraction, as well as for phase shift interferometry measurements like side by side technologies.

In the following, it is noted that the term "aperture" as used in this application refers to the any aperture in the optical metrology system, which may be placed at, or close to, field planes (like a collection field stop or an illumination field stop) and/or pupil planes (like a pupil aperture) of the optical system.

The following derivation is used to reach a method for aligning at least one aperture to an optical axis of a scatterometry metrology tool using a correction term derived by minimizing an overlay variation measure with respect to overlay measurements of a periodic structure.

Assuming that the per-pupil pixel overlay (OVL) measurement dependency on the misalignment error is as follows, $$\text{OVL}(\vec{k},\vec{d}) = \text{OVL}_{real} + \vec{d}\cdot\vec{A}(\vec{k}) + \mathcal{O}(d^2), \quad \text{Equation 1}$$

with the vector $\vec{d}$ being the misalignment vector, $\vec{k}$ being the wave vector that corresponds to a certain pupil point, and the vector $\vec{A}$ being the overlay linear response to the misalignment. Equation 1 holds to leading order in the misalignment vector $\vec{d}$, as the term $\tilde{d}(d^2)$ suggests. Setting the target's overlay at zero removes the term $\text{OVL}_{real}$. Importantly, $\vec{A}$ depends on wavelength, on the details of the wafer reflectivity, on the pupil point, and on the target design. For example, one can show that for a grating in the X direction, which measures the overlay in the X-direction, Equation 2 holds:

$$A_x \gg A_y. \quad \text{Equation 2}$$

In fact, simulations show that the ratio between $A_x$ and $A_y$ can easily reach several orders of magnitude.

Using Equation 1, the inventor has determined that the weighted average of the per-pupil-pixel overlay fluctuations (3 sigma), denoted by OVL3S, obeys Equation 3:

$$OVL3S(\vec{d}) = \sqrt{d_x^2 \widetilde{A_x^2} + d_y^2 \widetilde{A_y^2} + 2d_x d_y \widetilde{A_x A_y}} \cong |d_x|\sqrt{\widetilde{A_x^2}} + \ldots \quad \text{Equation 3}$$

With the tilde operator ~ defined as the two-point function $\widetilde{A_r A_s} \equiv \langle A_r A_s \rangle - \langle A_r \rangle \langle A_s \rangle$, with the brackets denoting a pupil averaging. Importantly, evaluating the OVL3S does not require any prior knowledge on the overlay itself, and can be done on the fly and very quickly.

Based on this analysis, the disclosed alignment method comprises accurately measuring the misalignment $d_x$, e.g., applying the following steps: (i) performing several SCOL measurements of a calibration target which has a zero overlay (for example, a single grating); (ii) changing the misalignment $\vec{d}$ between the measurements and (iii) calculating the OVL and the OVL3S for each measurement. Then, using data fitting, analytic estimates for these functions may be generated.

The estimated OVL3S function may be minimized to obtain an estimate for the value $\vec{d}_{min}$ which minimized the OVL3S. Since $A_x \gg A_y$, this "misalignment" value obeys $$\vec{d}_{min} \cong d_{x,min}\hat{x} + \mathcal{O}\left(\frac{A_y}{A_x}\right),$$

and corresponds to the centered position of the radiation spot within the aperture system. $\vec{d}_{min}$ is hence chosen as the correction term for aligning the respective aperture and may be used to align the aperture system to the optical system.

In certain embodiments, the process may be applied to targets having a non-zero overlay, e.g., regular scatterometry targets, and not necessarily calibration targets. Having zero overlay. The target's overlay may then be subtracted as $\text{OVL}_{real}$ from measured overlays, using Equation 1.

The calculated misalignment d (e.g., $d_x$) may be used to derive correction term(s) which define aperture readjustment value(s).

Figure 1A:
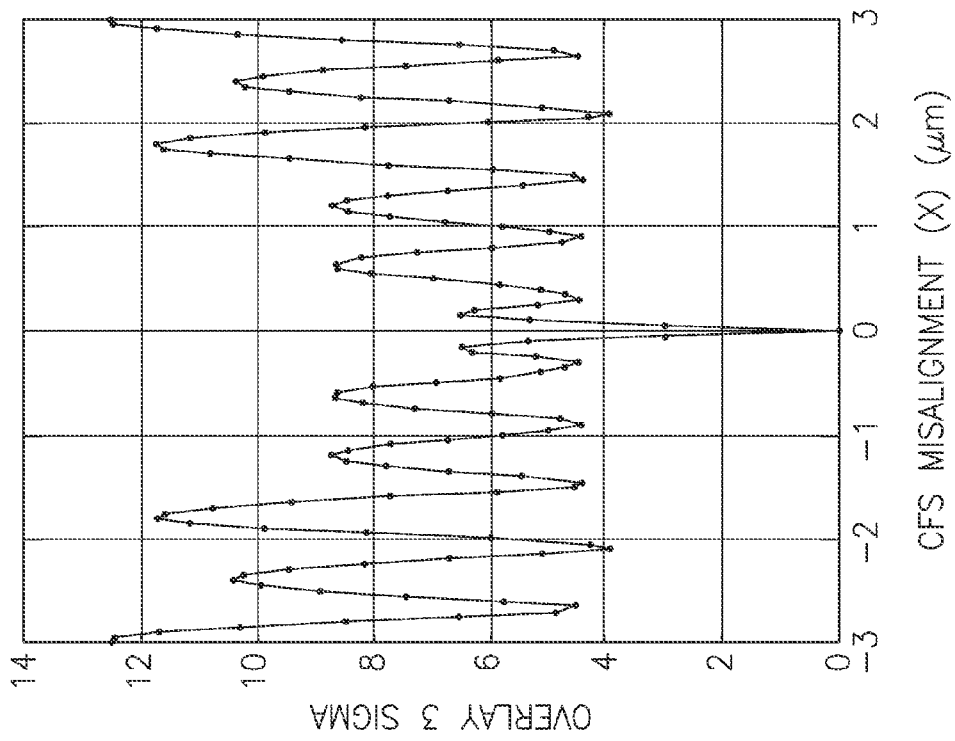
FIG. 1A is a graphical representation of exemplary simulation results that illustrate the minimization of the overlay variation measure, according to some embodiments of the invention.
Figure 2A:
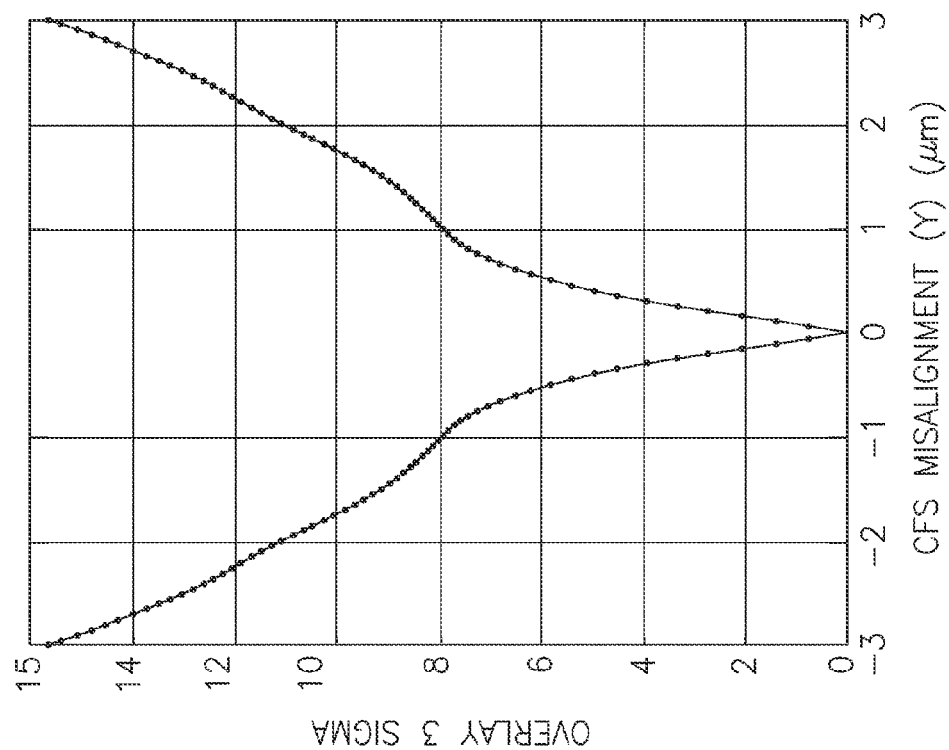
FIG. 2A is a graphical representation of exemplary simulation results that illustrate the minimization of the overlay variation measure, according to some embodiments of the invention.
Figure 2B:
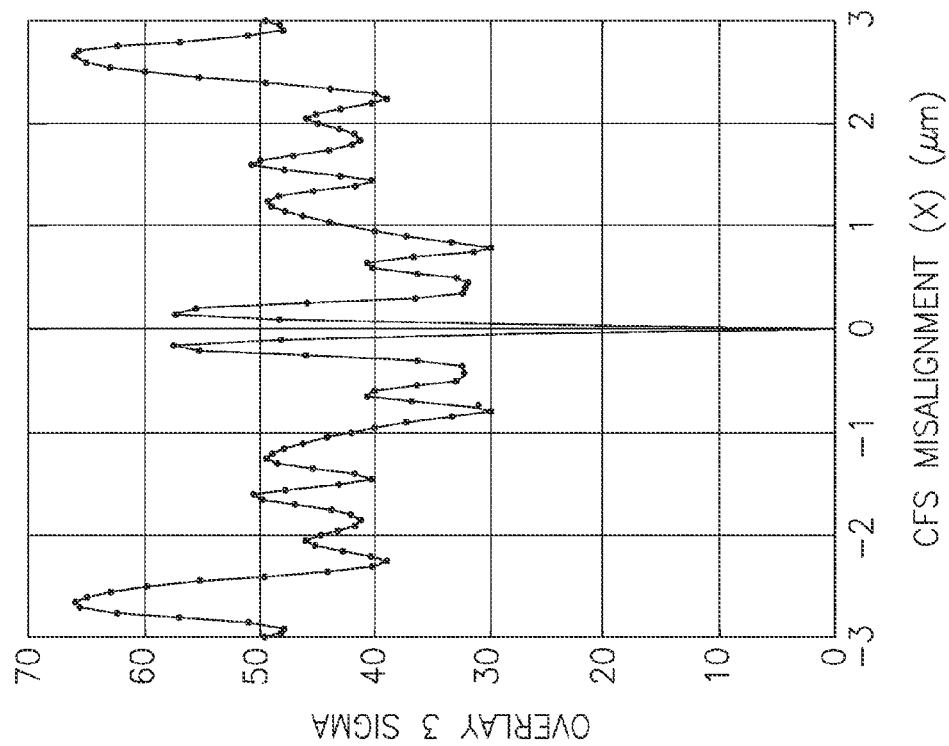
FIG. 2B is a graphical representation of exemplary simulation results that illustrate the minimization of the overlay variation measure, according to some embodiments of the invention; and, FIG. 3 is a high level flowchart illustrating an aperture alignment method, according to some embodiments of the invention.

FIGS. 1A, 1B and 2A, 2B are exemplary simulation results that illustrate the minimization of the overlay variation measure, according to some embodiments of the invention. FIGS. 1A, 2A depict weighted averaged OVL3S versus the x-coordinate of the misalignment vector $d_x$ of a hard edged square collection field stop (CFS), from 1st order SCOL, while FIGS. 1B, 2B depict weighted averaged OVL3S versus the y-coordinate of the misalignment vector $d_y$ of the same. FIGS. 1A, 1B were simulated for silicon as the bottom layer while FIGS. 2A, 2B were simulated for patterned metal as the bottom layer. In both cases the target was a periodic structure which is periodic along the x axis.

FIGS. 1A, 2A illustrate a clear minimum of the weighted averaged OVL3S value, which indicates the correction term in terms of the misalignment $d_x$. FIGS. 1B, 2B illustrate a clear minimum of the weighted averaged OVL3S value, which indicates the correction term in terms of the misalignment $d_y$. The fluctuations of OVL3S along the x axis and not along the y axis result from the periodicity of the periodic structure, which is along the x axis. In both cases however, the minima are clearly defined and may be used as correction terms for aperture alignment.

FIG. 3 is a high level flowchart illustrating a method 200, according to some embodiments of the invention. Method 200 may be at least partially implemented by at least one processor, and stages of method 200 may be implemented in respective computer program products comprising a computer readable storage medium having computer readable program embodied therewith and configured to carry out respective stages or parts thereof.

Method 200 may comprise aligning at least one aperture to an optical axis of a scatterometry metrology tool (stage 210) using a correction term derived (stage 215) by minimizing an overlay variation measure calculated from overlay measurements of a periodic structure (stage 220). In certain embodiments, the overlay measurements may be carried out in at least one axis of symmetry of the periodic structure, for example along and/or across the periodic structure (stage 225). The periodic structure may be designed at a single layer and lack an overlay (stage 227), to set the term $\text{OVL}_{real}$ of Equation 1 at zero.

The overlay variation measure may be calculated with respect to a pupil plane (stage 230), e.g., with respect to a weighted average of the overlay measurements over the pupil plane (stage 235). The overlay variation measure may be proportional to a standard deviation of the overlay measurements, e.g., be set at 3σ (stage 237).

Aperture alignment may be carried out in a calibration stage and/or on the fly (stage 240), and any of deriving 215, minimizing 220 and calculating 230 may be carried out at least partly using a processor (stage 250). The aligning procedure may be integrated in the metrology tool (stage 255) in any way (e.g., a specific module, implemented in hardware and/or software or integrated within existing modules). Special targets and periodic structures may be designed to optimize alignment measurements.

Method 200 may, for example, comprise performing several scatterometry measurements of a calibration target which has a zero overlay (stage 222); varying the misalignment between the measurements (stage 228); calculating the OVL and the OVL3S for each measurement (stage 232); generating analytic estimates for the overlay variation measures using data fitting (stage 236) and minimizing the estimated OVL3S function to calculate the misalignment (stage 238).

In certain embodiments, implementation may be carried out in a computer program product comprising a computer readable storage medium having computer readable program embodied therewith and configured to derive a correction term for aligning at least one aperture to an optical axis of a scatterometry metrology tool by minimizing an overlay variation measure calculated from overlay measurements of a periodic structure. The computer readable program may be configured to carry out any part of the above listed stages.

Advantageously, the disclosed invention significantly increases the accuracy in measuring the misalignment of apertures to the optical axis in an optical metrology system and significantly reduces the misalignment sensitivity of the overlay measurement. Carrying out the measurements and analysis with respect to the pupil plane improves the robustness of the misalignment correction and thus allows releasing the tight specs on the accuracy and repeatability of the aperture alignments. Finally, the disclosed invention enables practicing overlay metrology with very small targets in spite of the increased sensitivity to misalignment errors such targets introduce to measurements by prior art techniques.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method, comprising:
   translating an aperture located at an aperture plane of a scatterometry metrology tool to a plurality of aperture positions within the aperture plane;
   performing, with the scatterometry metrology tool, an overlay measurement of a periodic structure at each aperture position of the plurality of aperture positions;
   calculating, with one or more processors, an overlay variation measure for each aperture position of the plurality of aperture positions, wherein the overlay variation measure is configured to correlate to a deviation of the aperture from an aligned aperture position;
   determining, with one or more processors, the aligned aperture position based on the calculated overlay variation measures for each aperture position of the plurality of aperture positions; and
   aligning the aperture in the scatterometry metrology tool to the aligned aperture position within the aperture plane.

2. The method of claim 1, wherein calculating the overlay variation measure for each aperture position of the plurality of aperture positions comprises:
   generating an analytic function for a per-pupil pixel overlay measurement for each aperture position of the plurality of aperture positions.

3. The method of claim 2, wherein calculating the overlay variation measure for each aperture position of the plurality of aperture positions comprises:
   generating an analytic function for a weighted average of the per-pupil pixel overlay measurement for each aperture position of the plurality of aperture positions.

4. The method of claim 3, wherein determining the aligned aperture position based on the calculated overlay variation measures for each aperture position of the plurality of aperture positions comprises:
   minimizing the analytic function for the weighted average of the per-pupil pixel overlay measurement for each aperture position of the plurality of aperture positions to determine the aligned aperture position.

5. The method of claim 1, wherein the periodic structure has a zero overlay.

6. The method of claim 1, further comprising:
   deriving a correction term from the aligned aperture position, wherein aligning the aperture in the scatterometry metrology tool to the aligned aperture position includes aligning the aperture using the correction term.

7. The method of claim 1, wherein translating the aperture located at an aperture plane of a scatterometry metrology tool to a plurality of aperture positions within the aperture plane comprises:
   translating the aperture along at least one axis of symmetry of the periodic structure, wherein the overlay measurement of the periodic structure at each aperture position of the plurality of aperture positions is performed along the at least one axis of symmetry of the periodic structure.

8. The method of claim 1, wherein calculating the overlay variation measure for each aperture position of the plurality of aperture positions comprises:

calculating the overlay variation measure for each aperture position of the plurality of aperture positions based on a pupil plane of the scatterometry metrology tool.

9. The method of claim 8, wherein calculating the overlay variation measure for each aperture position of the plurality of aperture positions based on the pupil plane includes calculating the overlay variation measure based on a weighted average of the overlay measurement over the pupil plane.

10. The method of claim 1, wherein the overlay variation measure calculated for each aperture position of the plurality of aperture positions is proportional to a standard deviation of the overlay measurement.

11. The method of claim 10, wherein the overlay variation measure calculated for each aperture position of the plurality of aperture positions is proportional to a $3\sigma$ deviation of the overlay measurement.

12. The method of claim 1, wherein aligning the aperture in the scatterometry metrology tool to the aligned aperture position includes aligning the aperture in the scatterometry metrology tool during a calibration stage.

13. The method of claim 1, wherein the periodic structure includes a single layer and lacks an overlay value.

14. A metrology system, comprising:
an aperture located at an aperture plane;
a controller, wherein the controller includes one or more processors configured to implement one or more program instructions configured to cause the one or more processors to:
direct the translation of the aperture to a plurality of aperture positions within the aperture plane;
perform an overlay measurement of a periodic structure at each aperture position of the plurality of aperture positions;
calculate an overlay variation measure for each aperture position of the plurality of aperture positions, wherein the overlay variation measure is configured to correlate to a deviation of the aperture from an aligned aperture position; and
align the aperture to the aligned aperture position within the aperture plane.

15. The metrology system of claim 14, wherein calculating the overlay variation measure for each aperture position of the plurality of aperture positions comprises:
generating an analytic function for a per-pupil pixel overlay measurement for each aperture position of the plurality of aperture positions.

16. The metrology system of claim 15, wherein calculating the overlay variation measure for each aperture position of the plurality of aperture positions comprises:
generating an analytic function for a weighted average of the per-pupil pixel overlay measurement for each aperture position of the plurality of aperture positions.

17. The metrology system of claim 15, wherein determining the aligned aperture position based on the calculated overlay variation measures for each aperture position of the plurality of aperture positions comprises:
minimizing the analytic function for the weighted average of the per-pupil pixel overlay measurement for each aperture position of the plurality of aperture positions.

18. The metrology system of claim 14, wherein the periodic structure has a zero overlay.

19. The metrology system of claim 14, wherein the one or more processors are further configured to implement one or more program instructions configured to cause the one or more processors to:
derive a correction term from the aligned aperture position, wherein aligning the aperture includes aligning the aperture using the correction term.

20. The metrology system of claim 14, wherein the one or more processors are configured to implement one or more program instructions configured to cause the one or more processors to direct the translation of the aperture along at least one axis of symmetry of the periodic structure such that the overlay measurement of the periodic structure at each aperture position of the plurality of aperture positions is performed along the at least one axis of symmetry of the periodic structure.

21. The metrology system of claim 14, wherein calculating the overlay variation measure for each aperture position of the plurality of aperture positions based on a pupil plane.

22. The metrology system of claim 21, wherein calculating the overlay variation measure for each aperture position of the plurality of aperture positions based on the pupil plane includes calculating the overlay variation measure based on a weighted average of the overlay measurement over the pupil plane.

23. The metrology system of claim 14, wherein the overlay variation measure calculated for each aperture position of the plurality of aperture positions is proportional to a standard deviation of the overlay measurement.

24. The metrology system of claim 23, wherein the overlay variation measure calculated for each aperture position of the plurality of aperture positions is proportional to a $3\sigma$ deviation of the overlay measurement.

25. The metrology system of claim 14, wherein aligning the aperture to the aligned aperture position includes aligning the aperture during a calibration stage.

26. The metrology system of claim 14, wherein the periodic structure includes a single layer and lacks an overlay value.

27. The metrology system of claim 14, wherein the aperture plane comprises a field plane.

28. The metrology system of claim 14, wherein the aligned aperture position corresponds to an optical axis.

* * * * *